United States Patent [19]

Ebel et al.

[11] Patent Number: 5,046,045
[45] Date of Patent: Sep. 3, 1991

[54] METHOD OF STORING DATA IN A READ ONLY MEMORY TO ENHANCE ACCESS TIME

[75] Inventors: Mark S. Ebel; Michael R. McCoy, both of Los Altos, Calif.

[73] Assignees: Chipware, Inc., Los Altos; International Microelectronic Products, San Jose, both of Calif.

[21] Appl. No.: 495,359

[22] Filed: Mar. 16, 1990

[51] Int. Cl.$^5$ .................. G11C 17/10; G11C 7/00
[52] U.S. Cl. ............................ 365/189.01; 365/104
[58] Field of Search ............... 365/104, 94, 189.01, 365/51

[56] References Cited

U.S. PATENT DOCUMENTS 4,144,587 3/1979 Miyakawa et al. ............... 365/104
4,426,686 1/1984 Yamamoto et al. ............... 365/104

OTHER PUBLICATIONS

Rossbach, P. et al., "An Optimizing XROM Silicon Compiler", IEEE Custom Integrated Circuits Conference, 1987, pp. 13–16.

Primary Examiner—Joseph A. Popek
Assistant Examiner—Jack A. Lane
Attorney, Agent, or Firm—Henry K. Woodward

[57] ABSTRACT

The access time in reading data from a read only memory is enhanced by selectively inverting data stored in the memory. Each storage location along a wordline is weighted according to the distance of the bit location from the wordline driver, and bits stored therein are weighted by the bit location weight. The total weights of bits stored along the wordline are summed and compared with the maximum possible sum of weighted bits. If the ratio exceeds a preselected value, all bits of the wordline are inverted. The wordlines of a memory are provided with flag bits to indicate whether or not data stored on the wordline has been inverted.

5 Claims, 2 Drawing Sheets

METHOD OF STORING DATA IN A READ ONLY MEMORY TO ENHANCE ACCESS TIME

BACKGROUND OF THE INVENTION

This invention relates generally to the storage of data in electronic memories, and more particularly the invention relates to a read only memory (ROM) in which data is stored to reduce the time necessary in accessing the data.

A ROM is a read only memory in that the contents of the memory are permanently fixed in the memory during the manufacture thereof. The position of a particular bit of data is determined by row and column location. Typically, a "1" or "0" state is recorded by the presence or absence of an MOS transistor at the bit address. For example, the presence of the transistor can be a "1" and the absence of a transistor can be a "0". The programming of the data in the ROM is typically hard coded via a fabrication mask at the factory.

In reading data from a memory, time is required to take the applied address and transform it into row and column, obtain the data from the addressed location, and propagate the data to the output pin. This total time is known as the access time. A major component of the access time is the time required to energize the row information. This is also known as the wordline delay and is actually an RC time constant. When going to larger density devices it is necessary to increase the length of the wordline. Doubling the length of a wordline doubles the total resistance and the total capacitance making for a 4RC time constant. A four-fold increase in wordline delay is intolerable, and efforts have been made to reduce the time constant by circuit techniques.

One such technique is disclosed by Rossbach et al. in "An Optimizing XROM Silcon Compiler", IEEE 1987 Custom Integrated Circuits Conference, pages 13–15. This technique recognizes that a programmed "1" for the presence of a transistor adds more capacitance to the wordline than does a "0" or lack of a transistor. Rossbach et al. propose flipping all bits on a wordline if the number of programmed "1"s is more than half the total number of bits. In reading out data from the wordline the data must again be flipped to accurately read the data.

SUMMARY OF THE INVENTION

An object of the present invention is an improved electronic memory having enhanced access time.

Another object of the invention is a method of storing data in a memory whereby wordline delay is reduced.

A feature of the invention is the weighting of bit storage location and the summary of bits (either "1"s or "0"s) in a wordline as weighted by the bit storage location.

Another feature of the invention is the flipping of bits along the wordline when the weighted sum of bits exceeds a predetermined value.

Briefly, in accordance with a preferred embodiment, storage locations in a ROM are weighted along a wordline by the distance of the bit location from the wordline driver or wordline charging circuitry. If the weighted sum exceeds one-half of the possible weighted sum, then all bits along the wordline are inverted prior to programming.

A ROM in accordance with a preferred embodiment is provided with an inversion flag bit for each wordline which is set when data along the wordline is inverted. Logic means is provided for selectively inverting the stored data when the data is read in accordance with the flagged bit.

The invention and objects and features thereof will be more readily apparent from the following detailed description and appended claims when taken with the drawings.

DETAILED DESCRIPTION OF ILLUSTRATIVE EMBODIMENTS

Figure 1:
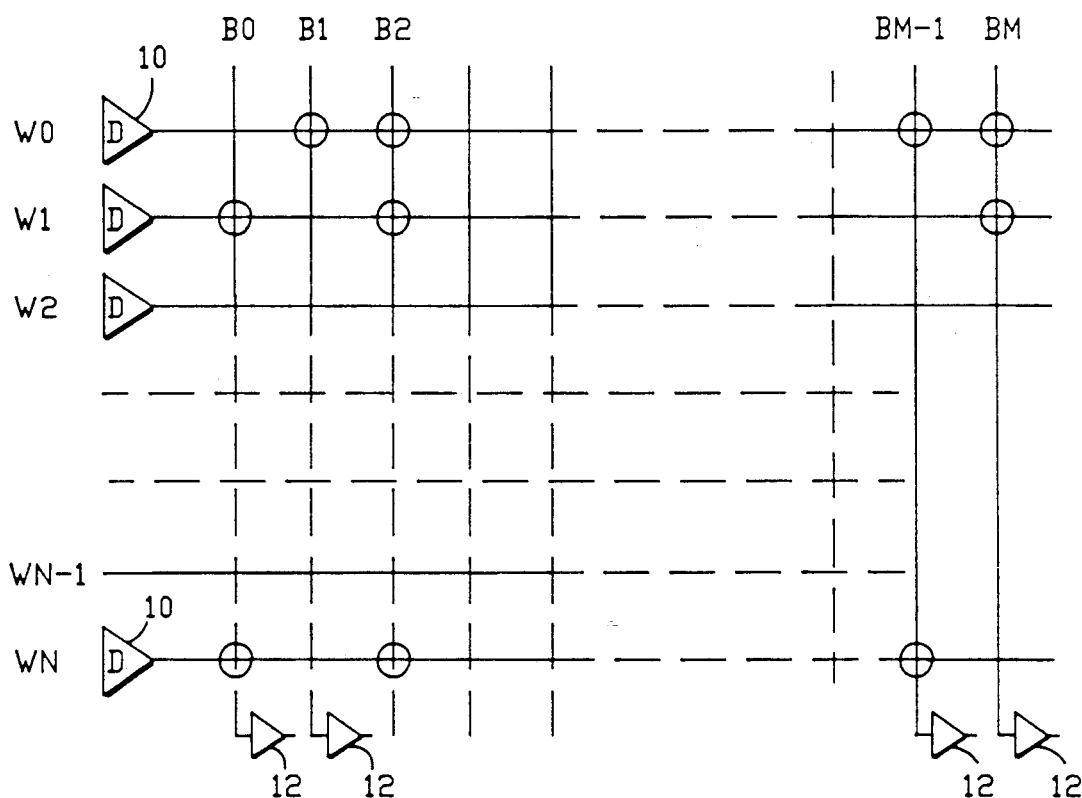
FIG. 1 is a functional representation of a read only memory.

Referring now to the drawing, FIG. 1 is a functional representation of a ROM. A plurality of columns or bit lines, $B_O$-$B_M$, intersect a plurality of rows or wordlines, $W_O$-$W_N$. The programming of a "1" or a "0" is implemented at the factory by a manufacturing mask. In FIG. 1 the circles at an intersection denote the presence of a "1" and the absence of a circle denotes a "0". As noted above, a "1" can be programmed by the provision of the transistor at a bit location, whereas a "0" can be programmed by the absence of a transistor. In reading data from the memory, a wordline is energized by a driver 10 and the stored bits of data are read out through sense amplifiers 12 connected to each of the bit lines.

As noted above, the access time in reading out a bit of data is affected largely by the wordline delay, or the time necessary in charging a wordline for the addressing of bits stored thereon. The wordline must reach a certain value of voltage before data can be obtained. The time to reach this voltage is determined by the resistance of the wordline and the capacitive load on the wordline. The capacitive load is dependent on whether or not a stored data bit is a "1" or a "0". If a "1" is programmed by the presence of a transistor at a bit address, the transistor adds to the capacitance of the wordline. Thus, the more "1" bits stored on a wordline the greater the capacitive loading. One prior art technique for minimizing the capacitive loading is to invert all bits stored on a wordline if the non-inverted "1" bits out number the non-inverted "0" bits.

Figure 2A:
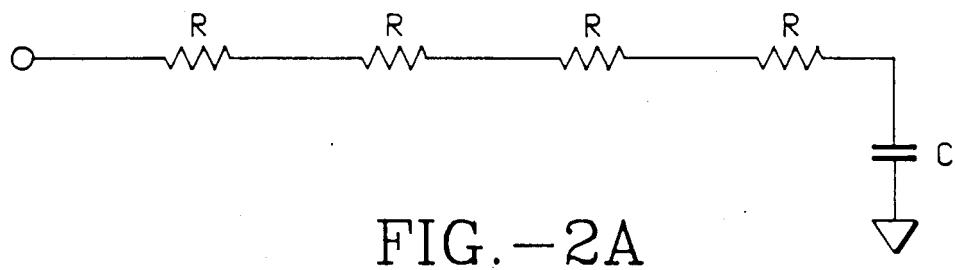
FIG. 2A and FIG. 2B are simple schematics illustrating the programming of a memory in accordance with the present invention.
Figure 2B:
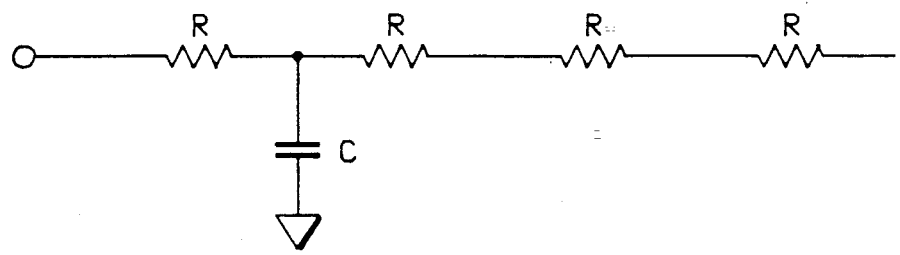

The present invention is directed to an improvement over the prior art in that bit locations along a wordline are weighted. This can be demonstrated in FIGS. 2A and 2B. In FIG. 2A the time constant of the wordline is the total resistance times the total capacitance or 4RC. However, in FIG. 2B the total resistance is R and the total capacitance is C and the time contact is RC. Thus, although one bit is programmed in each of FIGS. 2A and 2B, the RC load of the wordline, and the delay in the wordline, of FIG. 2A is four times greater than the delay of FIG. 2B.

Accordingly, bits farther from the wordline driver are given greater weight than bits closer to the driver. The relationship of the weighting is approximately linear in that a bit twice as far from the start of a wordline has twice the load as a bit half as far away. The weighting of the bits includes the following steps:

1. Determine the total weighting value if all bits along the wordline were a "1".
2. Start at the beginning of a wordline to be programmed and determine the weighted value of each programmed bit.
3. Obtain the total weight of a weighted program line.
4. If the total weight of a program line is greater than one half of the maximum weighted value, then invert all bits in the wordline.

Figure 3:
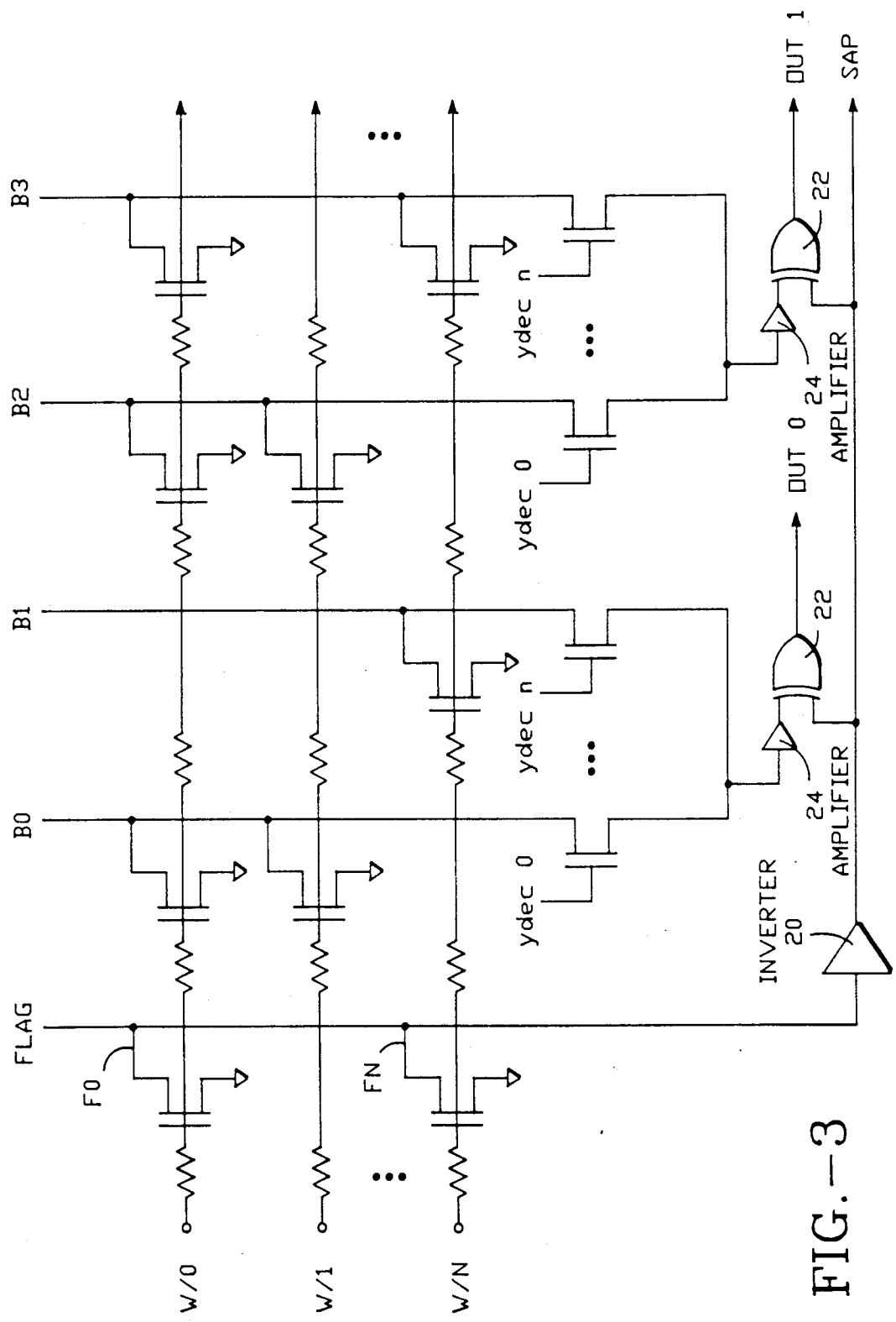
FIG. 3 is a schematic of a portion of a ROM in accordance with one embodiment of the invention.

FIG. 3 is a schematic of a portion of a ROM in which each wordline has been provided with a flag bit for indicating the inversion of bits stored therein. Again, the presence of a "1" along the wordline is indicated by the presence of a transistor, whereas a "0" is indicated by the lack of a transistor. A flag bit transistor is provided at the beginning of each wordline to indicate whether or not bits along the wordline have been inverted. For example, assume that the bits along wordline W0 and along wordline WN have been inverted. The transistors F0 and FN are present along the flag lines to indicate the bit inversion. On the other hand, assume that wordline 1 has not been inverted and a transistor is not present along the flag line for W1. When wordline 0 is read, the presence of the transistor F0 places a "0" on the flag line, and 0 is passed through inverter 20 to one input of exclusive OR gates 22. Another input to each exclusive OR gate 22 is obtained from the bit lines through sense amplifiers 24. If a wordline has been inverted, such as W0, a "1" is applied through inverter 20 to the exclusive OR arrays 22. Therefore the output from the exclusive OR gate will be inverted. For example, the ground on bit line B0 for wordline W0 is inverted by the exclusive OR gate 22 and becomes a "1" output. On the other hand, the ungrounded or positive voltage on bit line B1 for wordline W0 is inverted by exclusive OR gate 22 and becomes a "0". If the flag bit is a "0", as with wordline W1, then data from the wordline W1 is not inverted.

There has been described an improved memory in which access time is reduced by selective inversion of stored bits through selective weighting of bit locations along the wordline.

While the invention has been described with reference to specific embodiments, the description is illustrated with the invention and is not to be construed as limiting the invention. For example, a linear weighting of the storage bits can be utilized as described, or non-linear weighting can be employed if desired. Thus, various modifications and applications may occur to those skilled in the art without departing from the true spirit and scope of the invention as defined by the appended claims.

We claim:
1. A method of enhancing access time in reading data stored in a digital memory comprising the steps of
   a) assigning a weight to data storage locations along each wordline of a memory, said weight being based on the resistance-capacitance (RC) load associated with said data storage locations and a distance between respective ones of said data storage locations and a worldline drive,
   b) weighting each bit of a word to be stored along a wordline in accordance with the assigned weight and the "1" or "0" value of a bit corresponding to each storage location,
   c) summing the weighted bits of said wordline,
   d) determining a ratio of the summed weighted bits to a maximum possible sum of weighted bits,
   e) inverting all bits in on said wordline if said ratio exceeds a preselected value, and
   f) storing all bits said said word on said data storage locations along said wordline in memory.
2. The method as defined by claim 1 and further including the step of setting a flag in a wordline if bits stored therein have been inverted, said flag indicating that bits stored in said wordline have been inverted.
3. The method as defined by claim 1 wherein said weight is a linear function of said distance.
4. The method as defined by claim 2 wherein a "1" is indicated by the presence of a transistor at a bit location and a "1" is weighted more than a "0".
5. The method as defined by claim 2 wherein a "0" is indicated by the presence of a transistor at a bit location and a "0" is weighted more than a "1".

* * * * *